United States Patent [19]

Patzig

[11] Patent Number: 5,283,519

[45] Date of Patent: Feb. 1, 1994

[54] OPERATION OF INDUCTIVE DISTANCE SENSOR BY SCALING OUTPUT SIGNAL BY VECTORIALLY OBTAINED FACTOR

[75] Inventor: Hans N. Patzig, Bad Homburg, Fed. Rep. of Germany

[73] Assignee: VDO Luftfahrtgeräte Werk GmbH, Frankfurt, Fed. Rep. of Germany

[21] Appl. No.: 872,723

[22] Filed: Apr. 22, 1992

Related U.S. Application Data

[63] Continuation-in-part of Ser. No. 828,449, Jan. 30, 1992, abandoned.

[30] Foreign Application Priority Data

Jan. 30, 1991 [DE] Fed. Rep. of Germany ....... 4102655
Jan. 30, 1991 [DE] Fed. Rep. of Germany ....... 4102657

[51] Int. Cl.$^5$ .............................................. G01B 7/14
[52] U.S. Cl. ........................... 324/207.19; 324/207.24; 324/207.12
[58] Field of Search ............. 324/207.11–207.26, 324/234, 236, 237–240, 262; 340/870.31, 870.35, 870.36, 870.34

[56] References Cited

U.S. PATENT DOCUMENTS

| | | | |
|---|---|---|---|
| 3,491,289 | 1/1970 | Petrini | 324/207.16 X |
| 3,684,961 | 8/1972 | Muir | 324/207.19 X |
| 3,721,821 | 3/1973 | Blanyer | 324/207.19 X |
| 3,855,525 | 12/1974 | Bernin | 324/207.19 |
| 3,961,243 | 6/1976 | Schulz | 324/207.19 |
| 3,997,835 | 12/1976 | Ando et al. | |
| 4,269,070 | 5/1981 | Nelson et al. | 73/779 |
| 4,349,746 | 9/1982 | Grossner et al. | 324/207.16 X |
| 4,771,238 | 9/1988 | Caruso et al. | |
| 4,812,757 | 3/1989 | Meins et al. | 324/207.12 |
| 4,855,675 | 8/1989 | Russell et al. | 324/207.19 |
| 4,967,154 | 10/1990 | Marantette | 324/207.19 X |
| 5,015,948 | 5/1991 | Tew | |
| 5,045,786 | 9/1991 | Fischer | 324/207.19 X |

FOREIGN PATENT DOCUMENTS

| | | |
|---|---|---|
| 3345534 | 6/1985 | Fed. Rep. of Germany |
| 0224970 | 7/1985 | Fed. Rep. of Germany |
| 3576036 | 11/1986 | Fed. Rep. of Germany |
| 3814131 | 11/1989 | Fed. Rep. of Germany |

OTHER PUBLICATIONS

Patent Abstracts of Japan, vol. 8, No. 68 (P-264) (1505) Mar. 30, 1984 and JP-A-58214825 Dec. 14, 1983.

*Primary Examiner*—Gerard R. Strecker
*Assistant Examiner*—Warren S. Edmonds
*Attorney, Agent, or Firm*—Martin A. Farber

[57] ABSTRACT

A method of operating an induction distance sensor employs a sensor having a vane or tongue of magnetic material disposed movably between two inductive coils for changing their inductances in the opposite sense upon movement of the tongue. With respect to sensor signals $U_s$ and $U_e$, the method employs the portion $U_{sL}$ of $U_s$ which is in phase with the imaginary part $U_{eL}$ of $U_e$. Furthermore, the value $U_{sL}$ measured in this way is to be further increased by $U_e/U_{eL}$ in order to compensate for the temperature influences on the ohmic resistances. Furthermore, the errors which can be caused by erroneous controls $U_{e1}$ and $U_{e2}$ are also corrected. For this purpose, the total voltage is applied at intervals to a reference sensor which consists of a precision resistance divider. In this way, the exact middle point M of the total voltage $U_e = U_{e1}$ and $U_{e2}$ can be determined by measurement, and the middle-point voltage $U_m$ with respect to zero potential determined, which is divided into the real part $U_{MR}$ which is in phase with $U_e$ and the imaginary part $U_{ML}$ which lags behind it by 90°. With the phase angle $\alpha$ between $U_{eR}$ and $U_{eL}$, the correction value is $$\Delta U_{sL} = U_{MR} \times \sin \alpha + U_{ML} \times \cos \alpha.$$

13 Claims, 9 Drawing Sheets

OPERATION OF INDUCTIVE DISTANCE SENSOR BY SCALING OUTPUT SIGNAL BY VECTORIALLY OBTAINED FACTOR

RELATED APPLICATION

This application is a continuation-in-part application of my copending application Ser. No. 07/828,449 filed Jan. 30, 1992 now abandoned.

FIELD AND BACKGROUND OF THE INVENTION

The present invention relates to a method of operating an inductive distance sensor in which a first coil is acted on by a defined sinusoidal voltage $U_{e1}$ and a second coil, which is connected electrically in series with the first coil and is spaced from it, is acted on by a sinusoidal voltage of the same value but opposite phase $U_{e2}$. An element of magnetic material, which may be shaped as a tang or tongue, changes its relative distance from the coils and thus their inductances $L_1$ and $L_2$, the tongue being positioned between the coils under the influence of a measurement variable. A voltage $U_s$ with respect to zero potential is tapped off between the coils to serve as a useful signal.

A distance sensor of this type is known from U.S. Pat. No. 4,269,070 wherein the tongue is mounted separately from the coils to a beam, such as a bogie beam, to move relative to the coils in response to a bending of the beam, the bending constituting the measurement variable. It is used, inter alia, to determine the state of load of airplanes in which the load is determined by the shear flexure of the wheel axles or other supporting parts of the landing gear. For the evaluation of the signal, use is made either directly of the voltage $U_s$ or else of the portion $U_{se}$ thereof which is of the same phase as $U_{e1}$. In this connection, the result of the measurement can only be free of error if, on the one hand, the sinusoidal voltages $U_{e1}$ and $U_{e2}$ are exactly the same and precisely in phase opposition and, on the other hand, it can be assumed that the ohmic resistances in the two coil branches are exactly the same and do not change with temperature. Said conditions are not present in practice so that the signals obtained with such distance sensors are always subject to a greater or lessor error.

For uses in which the measurement error must not be greater than ±1%, it is, therefore, necessary to analyze the potential sources of error in order to seek possibilities of avoiding them or of compensating for them.

It is an object of the present invention to avoid errors connected to the use of $U_s$ or $U_{se}$ as measurement signal and to compensate for errors which are due to the ohmic resistances and their temperature-dependent change and are unavoidable despite careful manufacture and adjustment of the distance sensors. Furthermore, compensation is also to be effected of errors which result from the fact that $U_{e1}$ is not precisely equal to $U_{e2}$, that $U_{e1}$ and $U_{e2}$ are not precisely 180° out of phase, and/or that he sinusoidal voltages $U_{e1}$ and $U_{e2}$ differ from the pre-established value.

SUMMARY OF THE INVENTION

According to the invention:
the real part $U_{eR}$, and the imaginary part $U_{eL}$ of $U_e = U_{e1}$ plus $U_{e2}$ are determined with respect to size and phase;
the part $U_{sL}$ of $U_s$ which is in phase with $U_{eL}$ is measured; and
the value of $U_{sL}$ increased by the ratio $U_e/U_{eL}$ is used for the evaluation of the signal.

Also according to the invention:
a reference sensor consisting of an ohmic precision resistance divider is acted on by the sinusoidal voltages $U_{e1} + U_{e2} = U_e$ and the middle-point voltage $U_M$ with respect to zero potential is measured;
the portion $U_{MR}$ which is identical in polarity to $U_{e1}$ and of the same phase as $U_e$ and the portion $U_{ML}$ of $U_M$ which lags 90° behind same are determined and stored; thereupon
the distance sensor is acted on by the sinusoidal voltages $U_{e1} + U_{e2} = U_e$ and the real part $U_{eR}$ of $U_e$ and the imaginary part $U_{eL}$ as well as the corresponding phase angle $\alpha$ are determined;
the portion $U_{sL}$ of $U_s$ which is in the same phase as $U_{eL}$ is measured; and finally
$U_{sL}$ is corrected by subtraction of $\Delta U_{sL}$ equals $U_{MR} \times \sin \alpha + U_{ML} \times \cos \alpha$.

For the determination of the real part $U_{eR}$ and of the imaginary part $U_{eL}$ shifted 90° in phase to it, the passages through zero of the current $I_e$ corresponding to $U_e$ can be used. As an alternative, the zero passages of $U_e$ can be used to establish the portion of current of the same phase as $U_e$ and the portion shifted 90° in phase from it, to determine from the current portions the angle $\alpha$ of the phase shift between $U_e$ and $I_e$ and to use it for the determination of $U_{eR}$ and $U_{eL}$.

Finally, in order to determine $U_{eR}$ and $U_{eL}$, the phase shift of the zero passages between $U_e$ and $I_e$ can also be measured as $\Delta t$ and the angle $\alpha$ determined therefrom.

The method of the invention is, furthermore, suitable to compensate for the influences of temperature-dependent mechanical variables on the result of the measurement in the manner that the ratio $(U_{eL}/U_e)_x$ measured at a temperature $t_x$ is compared with a ratio $(U_{eL}/U_e)_0$ measured at a reference temperature $t_0$ and differences found in this connection are taken into account.

By means of a further tap H on the reference sensor, one can, furthermore, also compensate for errors resulting from the fact that the sinusoidal voltages $U_{e1}$ and $U_{e2}$ differ from the predetermined value since the expense for a constant voltage supply cannot be increased at will for financial reasons. For this purpose, the voltage $U_H$ with respect to zero potential is measured and the portion $U_{HR}$ of the same phase as $U_e$, reduced by $U_{MR}$, is compared with a constant reference voltage $U_K$ present as numerical value and used to form a factor $U_K/(U_{HR} - U_{MR})$, which then serves for the standardizing of $(U_{sL} - \Delta U_{sL})$.

For the operation of an inductive distance sensor, it is proposed to use as utilizable useful signal, not the directly measurable value $U_s$ or the portion $U_{se}$ of $U_s$ which is in phase with the control voltage $U_e$, but rather the portion $U_{sL}$ of $U_s$ which is in phase with the imaginary part $U_{eL}$ of $U_e$.

BRIEF DESCRIPTION OF THE DRAWING

With the above and other objects and advantages in view, the present invention will become more clearly understood in connection with the detailed description of the preferred embodiments, when considered with the accompanying drawing, of which.

DESCRIPTION OF A PREFERRED EMBODIMENT

Figure 1:
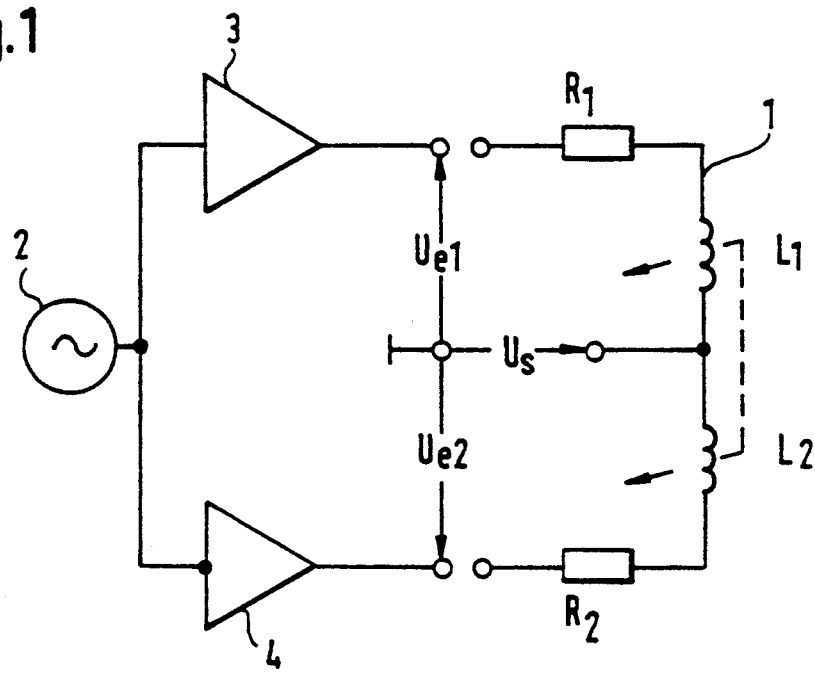
FIG. 1 is a circuit diagram which shows the basic circuit of the inductive distance measurer.

The inductive distance, or deflection, sensor 1 of FIG. 1 comprises two series-connected coils having the inductances $L_1$ and $L_2$ and the corresponding ohmic resistors $R_1$ and $R_2$. The two branches of the coil are controlled with the sinusoidal alternating voltages $U_{e1}$ and $U_{e2}$ from a source of alternating voltage 2 via amplifiers 3 and 4, said voltages being shifted 180° in phase from each other. The useful signal $U_s$ is tapped off with respect to zero potential between the coils. A vane or tongue or tongue-shaped element of magnetic material such as iron or other ferromagnetic material is arranged in the distance sensor between the coils, and is movable to change its relative distance from the coils under the influence of the measurement variable (shear flexure). As a result, the values of the inductances $L_1$ and $L_2$ are changed in opposite directions, one increases while the other decreases, so as to obtain a useful signal $U_s$ which corresponds to the change in inductance of the two coils.

Figure 2:
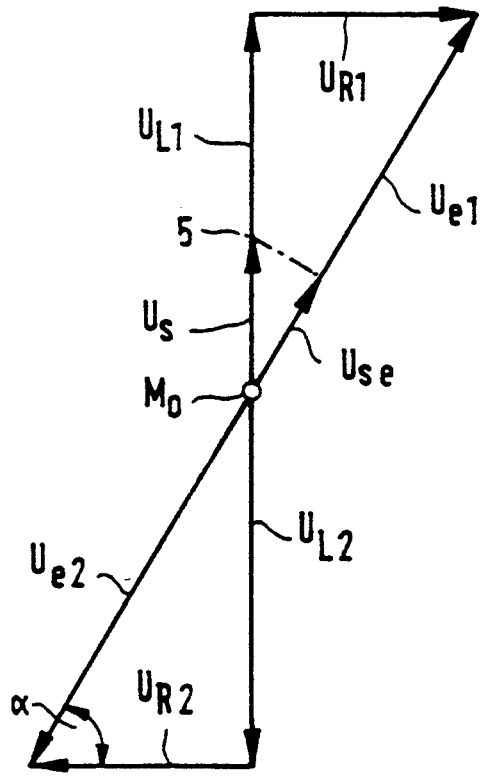
FIG. 2 shows the ideal vector diagram of the circuit.

FIG. 2 shows the vector diagram for the circuit of FIG. 1, which is obtained under the following conditions:

$U_{e1}$ precisely the same size as $U_{e2}$ $U_{e1}$ precisely in opposite phase to $U_{e2}$ $R_1$ precisely identical to $R_2$ $R_1$, $R_2$ independent of temperature Under these conditions, the triangles formed from $U_{e1}$, $U_{e2}$ and the corresponding real and imaginary parts $U_{R1}$, $U_{R2}$ and $U_{L1}$, $U_{L2}$ are congruent and—with constant angle $\alpha$—we have the relationships $U_L = U_e \times \sin \alpha$ and $U_R = U_e \times \cos \alpha$, with $U_{eL} = U_{L1} + U_{L2}$, $U_{eR} = U_{R1} + U_{R2}$ and $U_e = U_{e1} + U_{e2}$.

The useful signal $U_s$, which reproduces the deflection of the tongue from the central position and the "detuning" of $L_1$ and $L_2$ caused thereby is always to be measured from the middle point $M_o$ between $U_{e1}$ and $U_{e2}$ at a point 5 which lies on $U_L$ at a greater or lesser distance from the middle point depending on the amount of the "detuning". Under the said ideal conditions, the middle point of $U_e$ also lies on $U_{eL}$, i.e., $U_s$ is identical in phase to $U_{eL}$.

Figure 3A:
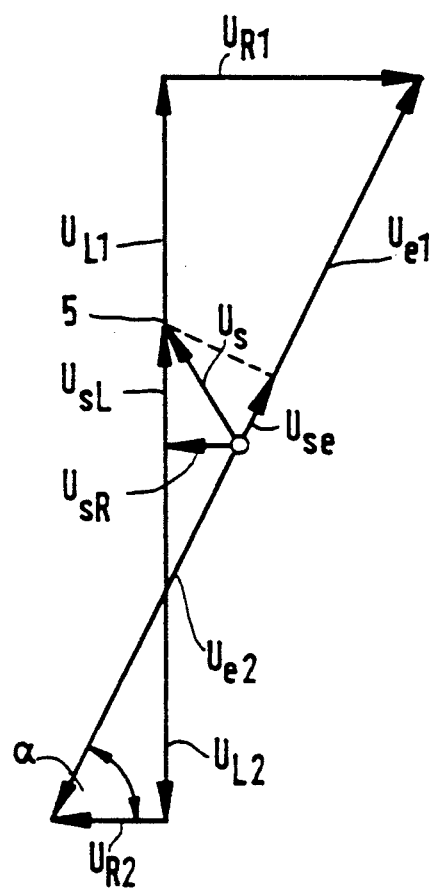
FIG. 3a shows the vector diagram for ohmic resistances of difference size.

If $R_1$ is not precisely equal to $R_2$, there is then obtained a vector diagram in accordance with FIG. 3a. It can be seen that the middle point of $U_e$ no longer lies on $U_{eL}$ and that $U_s$ accordingly is also no longer of identical phase with $U_L$. In the prior art, one had relied on there being no substantial differences between $R_1$ and $R_2$ and that an error-free signal being obtained with $U_s$. Another error results from the fact that, for reasons of measurement technique, the part $U_{se}$ of $U_s$ which is identical in phase with $U_e$ is frequently used rather than $U_s$. However, only $U_{sL}$, a value which is not easily measured from a standpoint of measurement technique, can be representative for the deflection of the tongue, i.e. for the measurement variable. In accordance with the invention, therefore, first of all real part $U_{eR}$ and imaginary part $U_{eL}$ of $U_e$ are determined with reference to size and direction.

Figure 4A:
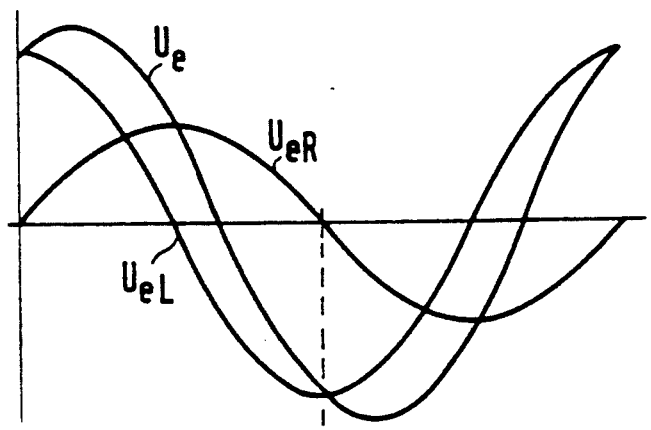
FIGS. 4A, 4B and 4C show the sinusoidal curves $U_e$, $U_{eR}$ and $U_{eL}$.
Figure 4B:
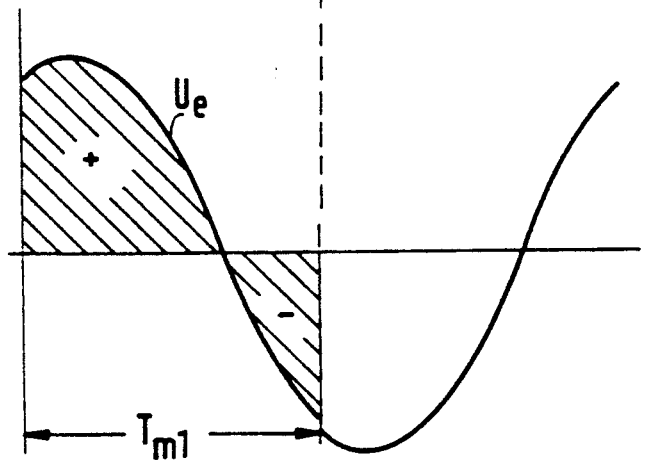
Figure 4C:
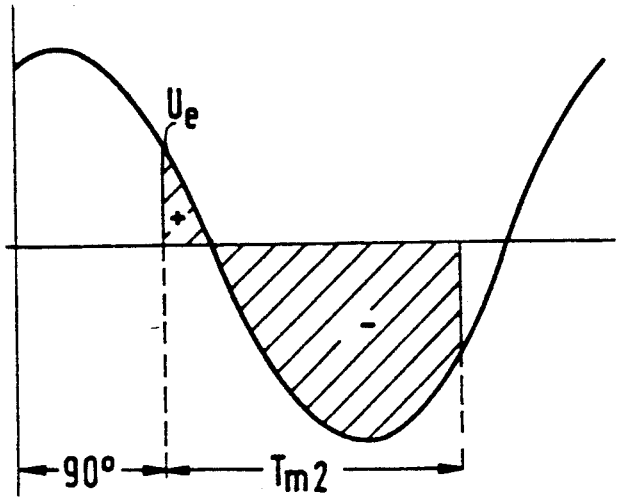

According to FIG. 4, the voltage $U_e$ consists of a part $U_{eR}$ which is identical in phase with the current $I_e$ and an imaginary part $U_{eL}$ which is shifted in phase to it by 90°. The passages through zero of $U_{eR}$ coincide with the passages through zero of $I_e$ so that one can determine the part $U_{eR}$ with a measurement window $T_{m1}$ which is limited by the passages through zero of $I_e$. With the measurement window $T_{m2}$ limited in the same manner but shifted in phase by 90°, the part $U_{eL}$ can also be determined by measurement. The measurement window $T_{m2}$ is also used in order to determine the portion $U_{sL}$ of $U_s$ which is identical in phase to $U_{eL}$.

Figure 5:
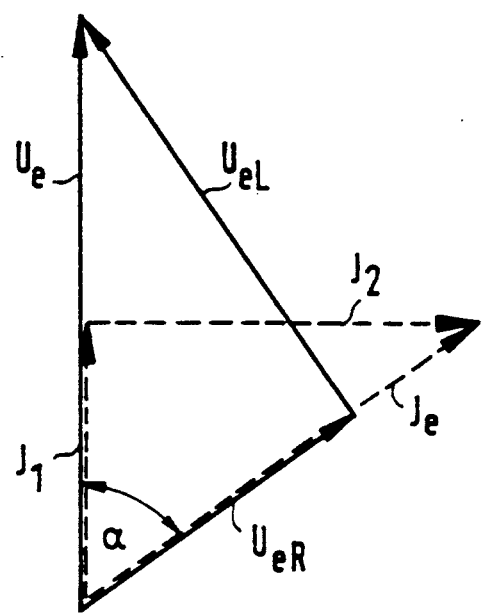
FIG. 5 shows the vector diagram $U_e/I_e$.

In similar manner, one can also proceed from the passages through zero of $U_e$, determine the portion of $I_e$ identical in phase with $U_e$ and the portion of $I_e$ shifted 90° in phase therefrom by means of a measurement window, and thus determine the angle $\alpha$ as well as the portions $U_{eR}$ and $U_{eL}$ in size and phase position (FIG. 5).

Figure 6:
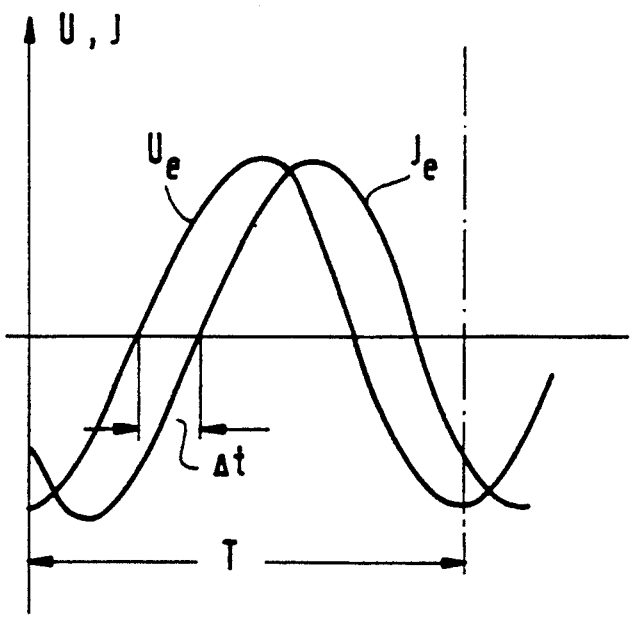
FIG. 6 shows the phase shift $U_e$ and $I_e$.

Finally, as shown in FIG. 6, the phase shift of the passages through zero between $U_e$ and $I_e$ as $\Delta t$ and the period T can also be measured and used for the calculation of $\alpha$. ($\alpha = 360 \times \Delta t/T$).

All of the foregoing methods are based on the determination of passages through zero and employ the known relationships between $U_e$, $U_{eR}$ and $U_{eL}$ and the corresponding angle functions. Therefore, in the individual case, one can decide which of the said methods or what methods equivalent thereto are best used in order to determine the desired portion $U_{sL}$, i.e. the portion of $U_s$ which is identical in phase to $U_{eL}$.

Figure 3B:
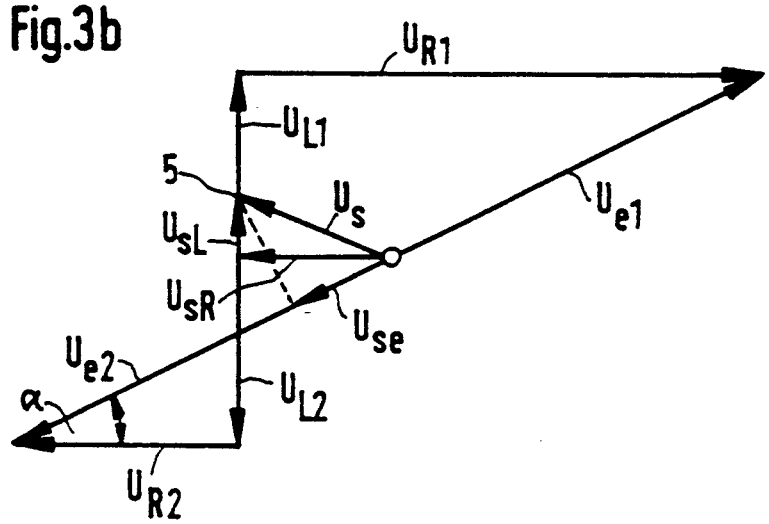
FIG. 3b shows the vector diagram for ohmic resistances of different size at a temperature of which is 250K higher.

If one, furthermore, takes into account the unavoidable temperature dependence of the ohmic resistances of the coils in accordance with FIG. 3b, then the errors caused by the use of $U_s$ or $U_{se}$ become even clearer. For constant $U_{e1}$ and $U_{e2}$ there is shown a doubling of the real portions $U_{R1}$ and $U_{R2}$, which corresponds to a doubling of the ohmic resistances and a considerable reduction in the angle $\alpha$. The large changes as compared with FIG. 3a selected to show the influences of the errors is entirely realistic. It results for copper coils having a temperature coefficient of 0.4%/K with a temperature change of 250K and, therefore, for instance, for a range of use of the distance sensor of $-50°$ to $+200°$ C.

In accordance with the relationship $U_{eL}^2 + U_{eR}^2 = U_e^2$, $U_{eL}$ for the same $U_e$ becomes smaller the larger $U_{eR}$ becomes. Accordingly, the determinative control voltage $U_{eL}$ for the coil decreases with increasing temperature so with the same deflection of the tongue too small a value $U_{sL}$ would be measured. The value $U_{se}$ which is frequently used for the evaluation is also greatly influenced by the temperature dependence of the ohmic resistances and can, therefore, not give off a useful signal.

In accordance with the invention, it is, therefore, furthermore proposed that the part $U_{sL}$ determined with the phase position of $U_{eL}$ be further increased by $U_e/U_{eL}$. In this way, the temperature influence on the controlling imaginary part of the control voltage for the coils is compensated for, and the portion $U_{sL}$ of $U_s$ which is determined as useful signal is practically always referred to the temperature-independent complex control voltage $U_e$.

By the method claimed, the error caused in traditional methods of measurement with the use of $U_s$ or $U_{se}$ is avoided and all error influences which are due to the ohmic resistances are compensated for. In this way, there is obtained a useful signal which substantially better satisfies the required needs for precision.

Figure 7:
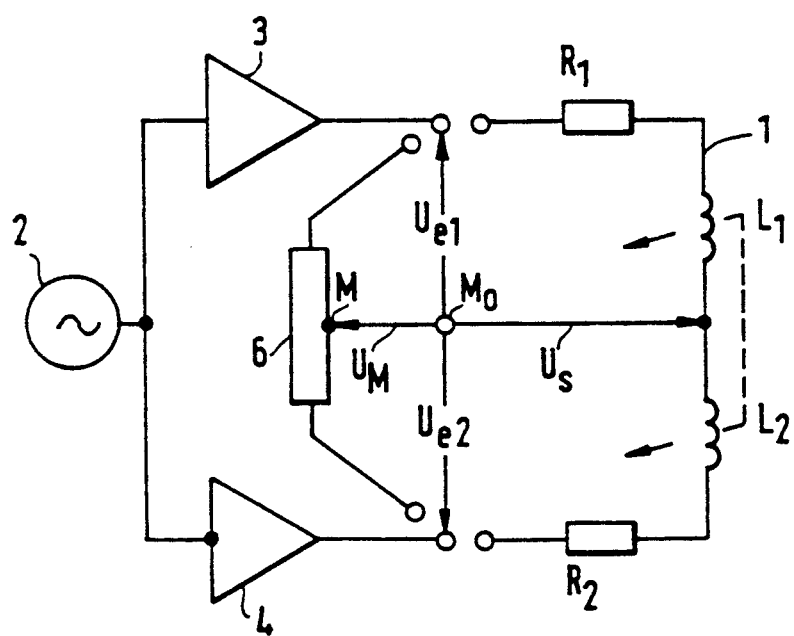
FIG. 7 shows the basic diagram of the inductive distance measurer with precision voltage divider.

Another source of error results if $U_{e1}$ and $U_{e2}$ differ from the ideal state. In order to compensate for this error a precision voltage divider is used. The inductive distance sensor 1 of FIG. 7 comprises two series-connected coils having the inductances $L_1$ and $L_2$ and the corresponding ohmic resistors $R_1$ and $R_2$. The two coil branches are controlled from a source of alternating voltage 2 via amplifiers 3 and 4 by the sinusoidal alternating voltages $U_{e1}$ and $U_{e2}$ which are shifted in phase 180° from each other. Between the coils, the useful signal $U_s$ with respect to zero potential is tapped off. By means of a tang or tongue (not shown in FIG. 1) of magnetic material such as iron arranged in the distance sensor between the coils and which changes its relative distance from the coils under the influence of the measurement variable (shear flexure), the inductances $L_1$ and $L_2$ are changed in opposite direction so that there is obtained a useful signal which corresponds to the change in inductance of both coils. 6 is a precision voltage divider which serves as reference sensor and with which the middle-point voltage $U_M$ can be determined.

Figure 8:
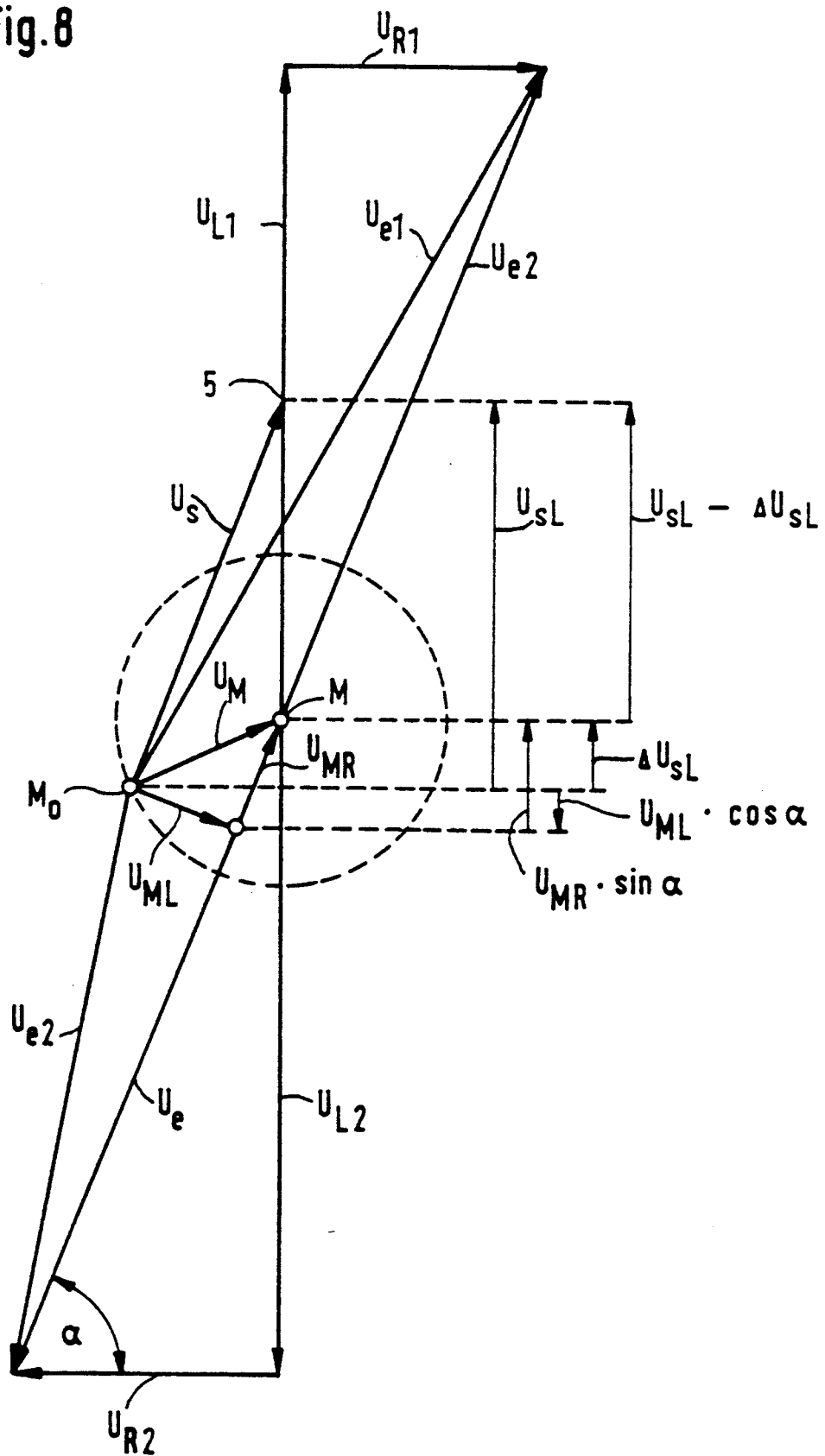
FIG. 8 shows the vector diagram for non-ideal $U_{e1}$ and $U_{e2}$.

If $U_{e1}$ is not precisely equal to $U_{e2}$ and if their phase position is not precisely 180° apart, there is then obtained a vector diagram in accordance with FIG. 8. From $U_{e1}$ and $U_{e2}$ there is obtained a total voltage $U_e$, the middle point of which is unknown. However, this middle point can be determined by measurement in accordance with the invention by applying the signal voltages $U_{e1}$ and $U_{e2}$ to a precision resistance divider. In this way, one has a reference sensor which divides the total voltage $U_e$ into portions of equal size and permits the measurement of a middle-point voltage $U_M$ with respect to zero potential. The dashed line circle in FIG. 8 marks an area in which $M_o$ can lie with respect to M and which is, therefore, representative for inaccuracies of the measurement signals possibly due to erroneous $U_{e1}$ and $U_{e2}$.

Since the reference sensor is a purely ohmic resistor, the portion $U_{MR}$ of $U_M$ which is of the same phase as $U_e$ corresponds to the difference in size between $U_{e1}$ and $U_{e2}$ and the portion $U_{ML}$ which lags by 90° corresponds to the angular error between $U_{e1}$ and $U_{e2}$. $U_{MR}$ and $U_{ML}$ are determined in accordance with the invention and placed in a data storage.

Thereupon the distance sensor is acted on by the sinusoidal voltages $U_{e1}$ and $U_{e2}$ and real part $U_{eR}$ and imaginary part $U_{eL}$ of $U_e$ are determined. Furthermore, the corresponding phase angle $\alpha$ is determined. From this, there results the possibility of also measuring the portion $U_{sL}$ of the useful signal $U_s$ which is of the same phase as $U_{eL}$. This value is too large by $\Delta U_{sL}$ in the example shown because of the erroneous $U_{e1}$ and $U_{e2}$ and must still be corrected. The error-free measurement signal corresponds namely only to the path between M and point 5. Expressed differently, the true zero position of the tongue results when point 5 and M coincide. Accordingly, the correction value can be determined as follows for the initially measured values $U_{MR}$ and $U_{ML}$ and the phase angle $\alpha$:

$$\Delta U_{SL} = U_{MR} \times \sin \alpha + U_{ML} \times \cos \alpha$$

Figure 9B:
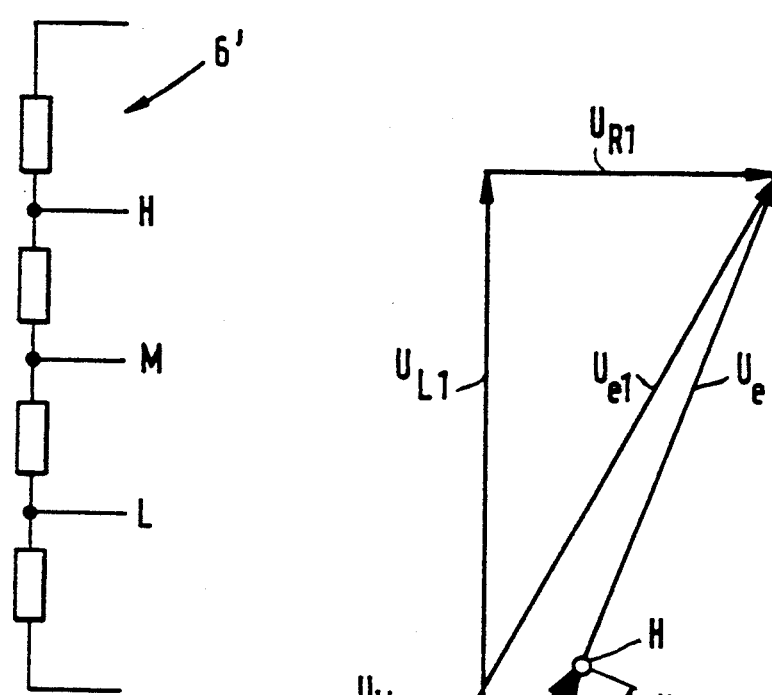
FIGS. 9A and 9B show the vector diagram for the standardizing of the useful signal.

In the method described up to now, it was assumed that the voltage supply of the distant sensor, while defective, was stable and, in particular, that $U_{e1}$ and $U_{e2}$ correspond to the amount in accordance with a predetermined value. If this condition is not satisfied, then a possibility must still be created for comparing the voltage $U_{e1}$ (and/or $U_{e2}$) with a constant voltage and standardizing the measurement signal which has already been corrected. For this purpose, the reference sensor 6' in FIG. 9b is provided with two additional taps H and L which are symmetrical to each other. What has been said with regard to the tap H, therefore applies in the same way to the tap L.

Figure 9A:
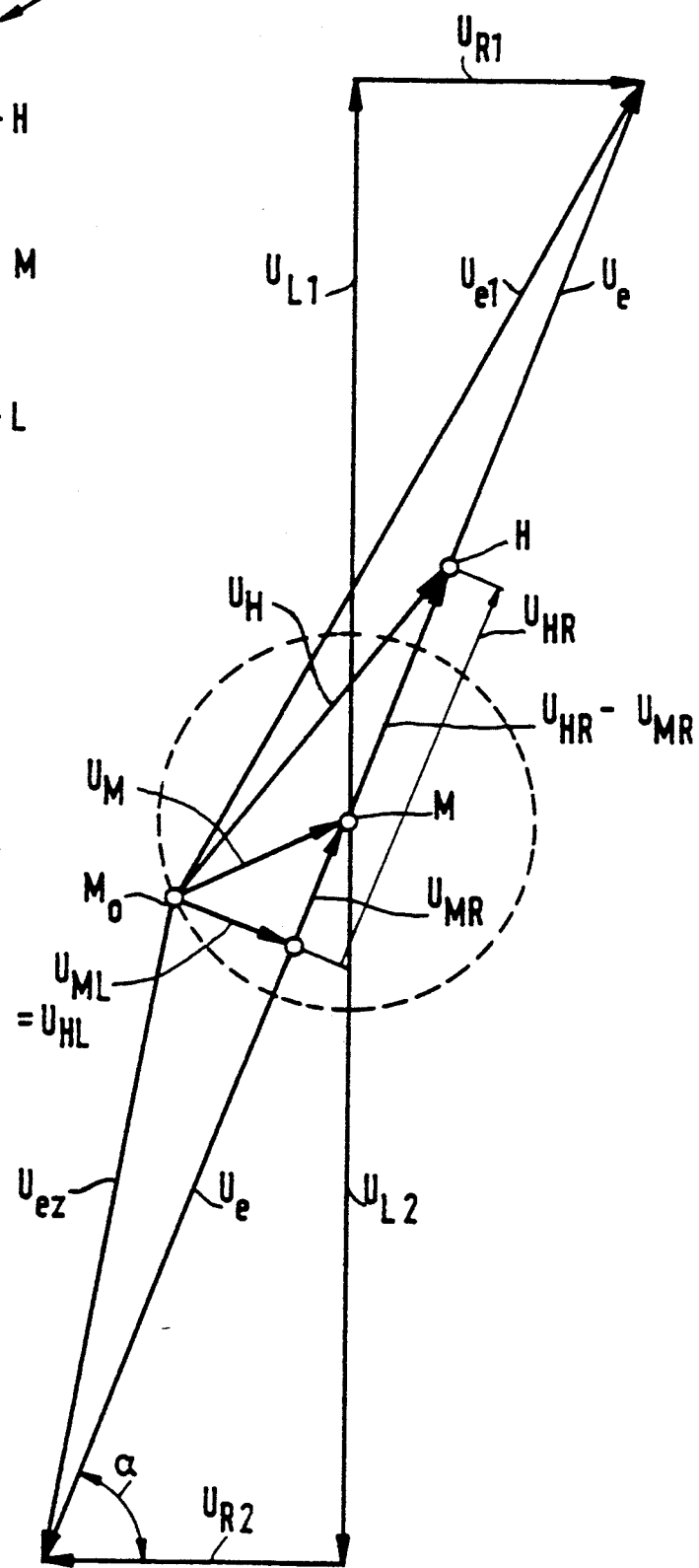

In the vector diagram of FIG. 9a, in addition to the voltages $U_e$, $U_{e1}$, $U_{e2}$, $U_{R1}$, $U_{R2}$, $U_{L1}$, $U_{L2}$, $U_M$, $U_{MR}$ and $U_{ML}$ known from FIG. 3 there is also entered a voltage $U_H$ which is measured between the tap H on the reference sensor and the zero potential $M_o$. It comprises the portion $U_{HR}$ which is in phase with $U_e$ and the portion $U_{HL}$ perpendicular thereto which coincides with $U_{ML}$. In accordance with the invention, the difference $U_{HR} - U_{MR}$ is compared with a constant voltage value $U_K$ present as numerical value and a factor $U_K/(U_{HR} - U_{MR})$ is formed therefrom for the standardizing of the corrected useful signal $(U_{sL} - \Delta U_{sL})$. In this way, it is possible to correct errors which result from the fact that the sinusoidal voltages $U_{e1}$ and $U_{e2}$ deviate from the predetermined value, which would otherwise be possible only at a considerably higher expense for the maintaining constant of the voltage supply.

By the method claimed the error caused in traditional measurement methods by the use of $U_s$ or of $U_{se}$ is avoided and all influences which are caused in connection with the measurement signal as a result of erroneous control voltages $U_{e1}$ and $U_{e2}$ are compensated for. In this way, one obtains a useful signal which is free of errors due to unequal ohmic resistances or non-ideal control voltages.

Determination of the voltage which really corresponds to the deflection is accomplished by the following steps.

1. Determination of faults caused by $U_{e1}$ being not exactly equal to $U_{e2}$ and not phase-shifted by exactly 180°:

Apply $U_e = U_{e1}$ and $U_{e2}$ to the reference sensor.
   Measure with the zero crossings of the corresponding current the voltage part $U_{HR}$ of $U_H$ and store it.
   Measure with the zero crossings of the corresponding current the voltage part $U_{MR}$ of $U_M$ and store it.
   Measure the voltage part $U_{ML}$ of $U_M$ (which is phase-shifted by 90° to the zero crossings of current and store it.

2. Determination of the losses caused by the ohmic resistance of the deflection sensor and the exitation wiring:

Apply $U_e = U_{e1}$ and $U_{e2}$ to the deflection sensor.

Measure with the zero crossings of the corresponding current the voltage part $U_{eR}$ of $U_e$ and store it.

Measure the voltage part $U_{eL}$ of $U_e$ which is phase-shifted by 90° to $U_{eR}$ and store it.

calculate $\alpha = \text{arctg}\,(U_{el}/U_{eR})$ and store it

3. Determination of $U_{sL}$:

Apply $U_e = U_{e1}$ and $U_{e2}$ to the deflection sensor.

Measure with the zero crossings of the corresponding current voltage part $U_{sL}$ of $U_S$ (which is phase-shifted by 90° to the zero crossings of the current) and store it.

4. Calculating the correction of $U_{sL}$:

Subtract $\Delta U_{sL} = U_{MR} \sin \alpha + U_{ML} \cdot \cos \alpha$ from $U_{sL}$. Multiply the result with $$\frac{U_e}{U_{eL}} = \frac{1}{\sin \alpha}$$

Multiply the result with a constant factor C divided by $U_{HR} - U_{MR}$ (to standarzise the supply voltage)

The complete formula is:

$$U_{SL}(\text{corrected}) = \frac{C \cdot [U_{SL} - (U_{MR} \sin \alpha + U_{ML} \cos \alpha)]}{\sin \alpha \,(U_{HR} - U_{MR})}$$

The corrected $U_{SL}$ can be used as a true signal of the deflection.

Figure 10:
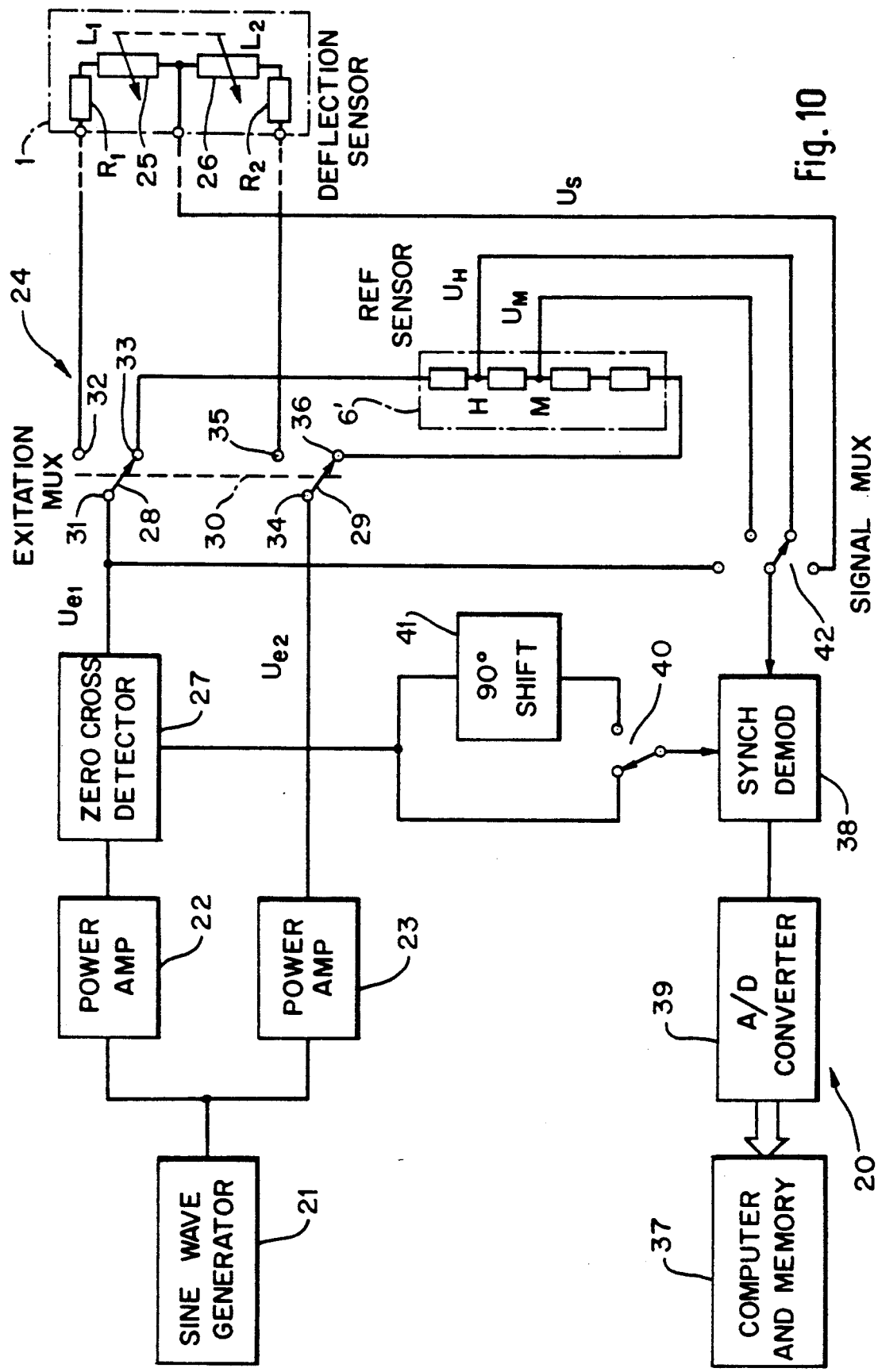
FIG. 10 shows the diagram which corresponds to the program for determining the voltage really corresponding to the deflection.

The foregoing measurement procedure can be carried out by use of measurement circuitry 20 shown in FIG. 10. The circuitry 20 comprises a sine wave generator 21 outputting a sinusoidal signal which is amplified by two power amplifiers 22 and 23. The amplifiers 22 and 23 apply current via a switch 24 to coils 25 and 26, respectively, of the deflection sensor 1. The coils 25 and 26 have the inductance $L_1$ and $L_2$ described previously with reference to FIGS. 1 and 7, and are connected serially via the resistors $R_1$ and $R_2$ through the switch 24 to the amplifiers 22 and 23. The signals outputted by the amplifiers 22 and 23 are reversed in phase. A zero-crossing detector 27 is inserted between the amplifier 22 and the switch 24.

The switch 24 is formed of two switch sections having arms 28 and 29 which are ganged together, as indicated by dashed line 30. Arm 28 is operative to connect electrically a switch pole 31 to either switch terminal 32 or switch terminal 33. Arm 29 is operative to connect electrically switch pole 34 to either switch terminal 35 or switch terminal 36. The voltage divider 6' which serves as a reference sensor (described previously with reference to FIG. 7 and 9b) is connected between terminals 33 and 36 of the switch 24, and receives current from the power amplifiers 22 and 23 with the switch arms 28 and 29 in the position indicated in FIG. 10. In the alternate position of the switch 24, current from the amplifiers 22 and 23 is directed to the coils 25 and 26 of the deflection sensor 1, instead of the voltage divider 6'. Thereby, the switch 24 performs the function of an excitation multiplexer for alternately exciting the deflection sensor 1 and the voltage divider 6'.

The circuitry 20 further comprises a computer 27 having memory, a synchronous demodulator 38, and an analog-to-digital convertor 39 which converts an output analog signal of the demodulator 38 to a digitally formatted signal which is applied by the converter 39 to the computer 37. The detector 27 outputs a reference signal to a reference input terminal of the demodulator 38 via a switch 40, the switch 40 enabling either a direct connection between the demodulator 38 and the detector 27 or, alternatively, a connection via a 90° phase shifter 41. The phase shifter 41 operates to introduce a 90° phase shift between a reference input signal of the demodulator 38 and an output reference signal of the detector 27. A switch 42 couples selectively any one of a plurality of input signals to the demodulator 38 for demodulation and transmission to the computer 37. Synchronous amplitude demodulation of the selected input signal is attained by use of either the direct output of the detector 27 or the phase-shifted output of the detector 27. The signals to be inputted via the switch 42 to the demodulator 38 include the output of the amplifier 22, a center reference $U_M$ from the voltage divider 6', a reference $U_H$ from the voltage divider 6', and a signal from the junction of the coils 25 and 26. Thereby the switch 42 performs the function of an input signal multiplexer. Data from these signals is employed by the computer 37 to carry out the foregoing procedures of the invention.

Figure 11:
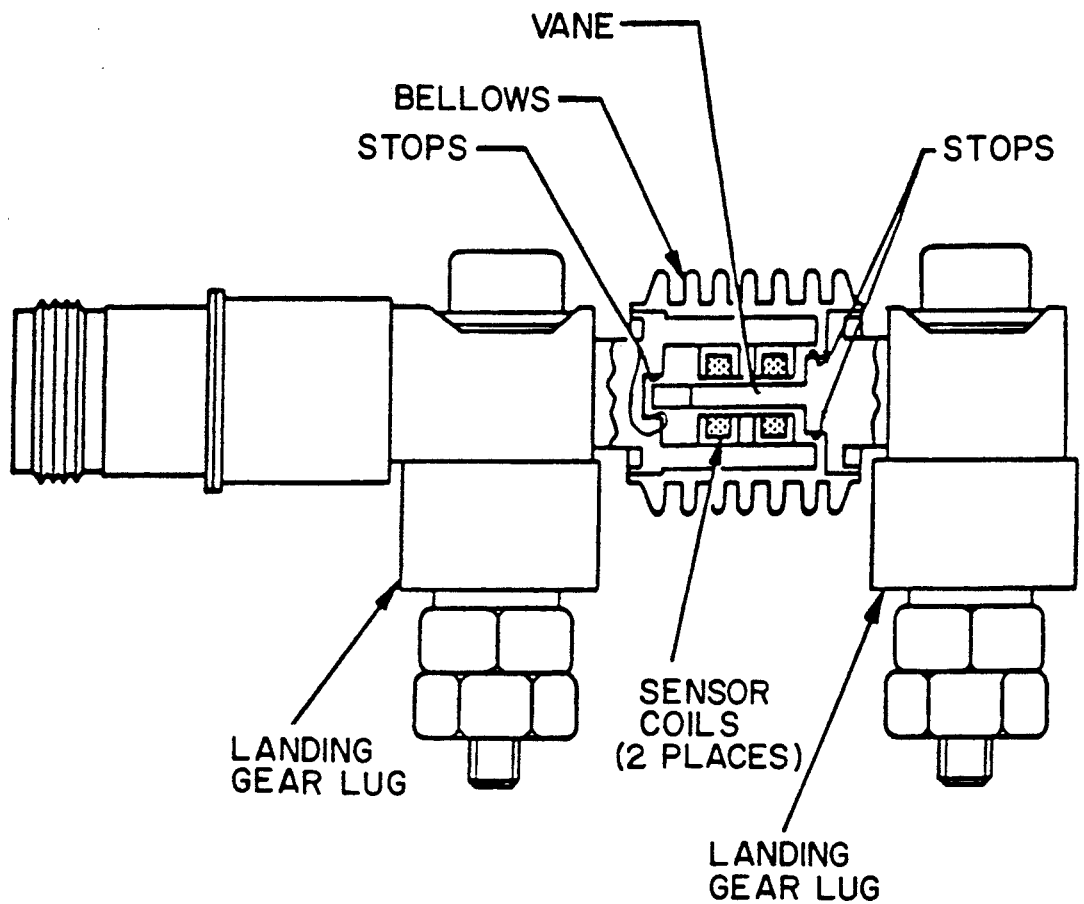
FIG. 11 is a view, partly stylized, of an aircraft load-measuring transducer of the prior art.

FIG. 11 is a simplified presentation of FIG. 3 of the aforementioned U.S. Pat. No. 4,269,070, and shows the physical arrangement of the vane (referred to in the patent as a plate) and the coils. As described hereinabove, the coils provide the inductances $L_1$ and $L_2$ of FIG. 1, with the values of the inductances being dependent on the positions of the inductances being dependent on the positions of the vane relative to each of the coils. The relative positions change with deflection of the transducer assembly under loading, by way of example, of an aircraft landing gear.

I claim:

1. A method of operating an inductive distance sensor for measurement of a load, the sensor comprising a vane, a first coil and a second coil which is connected electrically in series with the first coil and is spaced apart from the first coil, said vane being movable between said first and said second coils to change its relative distance from the coils and thus the magnitudes of their inductances $L_1$ and $L_2$, a position of said vane between the coils being under the influence of a measurement variable, the method comprising the steps of:

applying a first sinusoidal voltage $U_{e1}$ to said first coil and a second sinusoidal voltage $U_{e2}$ to said second coil, said sinusoidal voltages being of equal amplitude and opposite phase;

tapping off from a terminal connected between the coils an output signal having a voltage $U_S$ with respect to zero potential;

determining $U_{eR}$ and $U_{eL}$ of $(U_e = U_{e1} + U_{e2})$ with respect to magnitude and phase;

measuring a vectorial part $U_{sL}$ of $U_S$ which is in phase with $U_{eL}$; and multiplying the value of $U_{sL}$ by a ratio $U_e/U_{eL}$ for obtaining a measurement of the load.

2. A method of operating an inductive distance sensor for measurement of a load, the sensor comprising a vane, a first coil and a second coil which is connected electrically in series with the first coil and is spaced apart from the first coil, said vane being movable between said first and said second coils to change its relative distance from the coils and thus the magnitudes of their inductances $L_1$ and $L_2$, a position of said vane between the coils being under the influence of a measurement variable, the method comprising the steps of:

applying a first sinusoidal voltage $U_{e1}$ to said first coil and a second sinusoidal voltage $U_{e2}$ to said second coil, said sinusoidal voltages being of equal amplitude and opposite phase;

tapping off from a terminal connected between the coils an output signal having a voltage $U_S$ with respect to zero potential;

employing a reference sensor consisting of an ohmic precision resistance divider, and applying thereto the sinusoidal voltages $U_{e1} + U_{e2} = U_e$ of which there is a middle-point voltage $U_M$ with respect to zero potential;

measuring the middle point voltage $U_M$;

establishing a voltage portion $U_{MR}$ which is identical in polarity to $U_{e1}$ and of the same phase as $U_e$;

establishing a voltage portion $U_{ML}$ of $U_M$ which is shifted in phase by 90° to $U_{MR}$, wherein $U_{MR}$ is the real part of $U_M$, and $U_{ML}$ is the imaginary part of $U_M$;

storing values of the voltages $U_{MR}$ and $U_{ML}$;

applying a voltage $U_e$ equal to the sum of $U_{e1}$ and $U_{e2}$ to the inductive distance sensor and determining the voltages $U_e$, $U_{eR}$ and $U_{eL}$ as well as the corresponding phase angle $\alpha$ of $U_e$;

measuring the voltage portion $U_{sL}$ of $U_s$ which is in the same phase as $U_{eL}$; and correcting $U_{sL}$ by subtraction of $\Delta U_{sL}$ which equals $U_{MR} \times \sin \alpha + U_{ML} \times \cos \alpha$ to obtain a measurement of the load.

3. Method according to claim 2, further comprising a step of utilizing crossings through zero of the current $I_e$ in said coils resulting from impressing the voltage $U_e$ across the serial connection of said coils for a determination of the real part $U_{eR}$ and of the imaginary part $U_{eL}$ shifted 90° in phase to the real part.

4. Method according to claim 1, further comprising a step of utilizing crossings through zero of the current $I_e$ in said coils resulting from impressing the voltage $U_e$ across the serial connection of said coils for a determination of the real part $U_{eR}$ and of the imaginary part $U_{eL}$ shifted 90° in phase to the real part.

5. Method according to claim 1, further comprising a step of utilizing zero crossings of $U_e$ to establish a portion of current of the same phase as $U_s$ and a portion shifted 90° in phase from the phase of $U_s$, and to determine from the current portions the angle $\alpha$ of $U_e$ the phase shift between $U_e$ and $I_e$ for the determination of $U_{eR}$ and $U_{eL}$.

6. Method according to claim 2, further comprising a step of utilizing zero crossings of $U_e$ to establish a portion of current of the same phase as $U_s$ and a portion shifted 90° in phase from the phase of $U_s$, and to determine from the current portions the angle $\alpha$ of $U_e$ the phase shift between $U_e$ and $I_e$ for the determination of $U_{eR}$ and $U_{eL}$.

7. Method according to claim 2, further comprising a step, in order to determine $U_{eR}$ and $U_{eL}$, of measuring phase shift of zero crossings between $U_e$ and $I_e$ over a time interval $\Delta t$ and phase angle $\alpha$ of $U_e$, wherein $I_e$ is current flowing through the series connection of said coils in response to impressing the voltage $U_e$ across said coils.

8. Method according to claim 1, further comprising a step, in order to determine $U_{eR}$ and $U_{eL}$, of measuring phase shift of zero crossings between $U_e$ and $I_e$ over a time interval $\Delta t$ and phase angle $\alpha$ of $U_e$, wherein $I_e$ is current flowing through the series connection of said coils in response to impressing the voltage $U_e$ across said coils.

9. Method according to claim 1, further comprising a step of compensating for the influences of temperature-dependent mechanical variables on the result of the measurement, by employing the ratio $(U_{eL}/U_e)_x$ measured at a temperature $t_x$, and comparing the ratio with a ratio $(U_{eL}/U_e)_0$ measured at a reference temperature $t_0$ for employing a difference between the two ratios.

10. Method according to claim 2, further comprising a step of compensating for the influences of temperature-dependent mechanical variables on the result of the measurement, by employing the ratio $(U_{eL}/U_e)_x$ measured at a temperature $t_x$, and comparing the ratio with a ratio $(U_{eL}/U_e)_0$ measured at a reference temperature $t_0$ for employing a difference between the two ratios.

11. Method according to claim 2, further comprising a step of establishing a further tap H of the reference sensor;

measuring a voltage $U_H$ with respect to zero potential;

extracting and a portion $U_{HR}$ of $U_H$ having the same phase as $U_e$;

subtracting $U_{MR}$ from $U_{HR}$, and comparing a resulting difference with a constant reference voltage $U_K$ present as a numerical value; and forming a factor $U_K/(U_{HR} - U_{MR})$, which then serves for a standardizing of $(U_{sL} - \Delta U_{sL})$ wherein $\Delta U_{sL}$ is a deviation of $U_{SL}$.

12. Method according to claim 2, further comprising a step of connecting a switch between said first coil and a source of voltage, and operating said switch alternately to connect said first coil and a reference sensor alternately to said voltage source, said step of employing a reference sensor being accomplished by operation of said switch.

13. A method according to claim 12, further comprising a step of utilizing zero crossings of $U_e$ to establish a portion of current of the same phase as $U_s$ and a portion shifted 90° in phase from the phase of $U_s$, and to determine from the current portions the angle $\alpha$ of $U_e$ the phase shift between $U_e$ and $I_e$ for the determination of $U_{eR}$ and $U_{eL}$, wherein said step of utilizing zero crossings to establish a portion shifted 90° in phase as accomplished by connecting a phase shifter and a zero crossing detector to a signal line of said first coil to provide a phase reference for comparing with a signal at an output terminal of said switch.

* * * * *